United States Patent [19]

Backes et al.

[11] Patent Number: 4,633,106
[45] Date of Patent: Dec. 30, 1986

[54] MOS BOOTSTRAP PUSH-PULL STAGE

[75] Inventors: Reiner Backes, Freiburg; Friedrich Schmidtpott, Gundelfingen, both of Fed. Rep. of Germany

[73] Assignee: ITT Industries, Inc., New York, N.Y.

[21] Appl. No.: 614,295

[22] Filed: May 25, 1984

[30] Foreign Application Priority Data

May 27, 1983 [EP] European Pat. Off. ........ 83105252.7

[51] Int. Cl.⁴ .................... H03K 4/24; H03K 4/58; H03K 17/10; H03K 19/096
[52] U.S. Cl. .................................. 307/578; 307/482; 307/270
[58] Field of Search ............... 307/482, 578, 450, 453, 307/270

[56] References Cited

U.S. PATENT DOCUMENTS

| | | | |
|---|---|---|---|
| 3,988,617 | 10/1976 | Price | 307/453 |
| 4,042,838 | 8/1977 | Street et al. | 307/482 X |
| 4,284,905 | 8/1981 | Rosenzweig | 307/482 |
| 4,330,719 | 5/1982 | Nagami | 307/578 X |
| 4,388,538 | 6/1983 | Ikeda | 307/482 |
| 4,390,803 | 6/1983 | Koike | 307/270 X |
| 4,431,927 | 2/1984 | Eaton, Jr. et al. | 307/578 X |
| 4,500,799 | 2/1985 | Sud et al. | 307/482 X |

OTHER PUBLICATIONS

Fink et al, *Electronics Engineers' Handbook*, Second Edition, pp. 16-15 to 16-19, 1982.

*Primary Examiner*—Stanley D. Miller
*Assistant Examiner*—David Bertelson
*Attorney, Agent, or Firm*—Donald J. Lenkszus

[57] ABSTRACT

A circuit is described which holds the bootstrap node of a MOS push-pull end stage at a constant potential even if the end stage has to generate an output H-level. A diode/capacitor charge pump circuit supplies the required pulse current only fed to the node in case of the output H-level.

12 Claims, 3 Drawing Figures

MOS BOOTSTRAP PUSH-PULL STAGE

BACKGROUND OF THE INVENTION

This invention relates to a bootstrap push pull stage. More specifically, this invention relates to a digital monolithic integrated bootstrap push pull stage using insulated-gate field-effect transistor technology (MOS technology). Such a stage comprises two enhancement-mode output-stage transistors having their drain-source paths connected in series between the supply voltage and ground. A bootstrap capacitor has one of its terminals connected to the gate of the output-stage transistor coupled to the supply voltage, whereby the bootstrap node is formed, and has its other terminal connected to a point following the potential of the output of the bootstrap push-pull stage. The bootstrap push-pull stage further comprises a first charge pump circuit having its clock input connected directly to the output of a clock oscillator and having its first direct-voltage terminal, whose polarity is opposite to that of the supply voltage, connected to the supply voltage, and the inverters and capacitors.

A bootstrap push-pull stage of this kind is disclosed in Offenlegungsschrift DE No. 23 59 646. In that stage, manufacturing variations affecting the gate voltage are compensated for, so that operation within a linear range is ensured. The parameters of stages fabricated together with their load circuits on different semiconductor wafers vary if an externally generated gate voltage common to all push-pull stages is applied.

SUMMARY OF THE INVENTION

The object of the invention is to improve the prior art circuit so that during the presence of an output level corresponding to the potential of the supply voltage, the voltage at the bootstrap node remains as constant as possible even over prolonged periods and the output level remains constant as well. The invention makes it possible to hold the output at a constant logic level over prolonged periods of time.

BRIEF DESCRIPTION OF THE DRAWINGS

The invention will now be explained in greater detail with reference to the accompanying drawings, in which.

DETAILED DESCRIPTION

Figure 1:
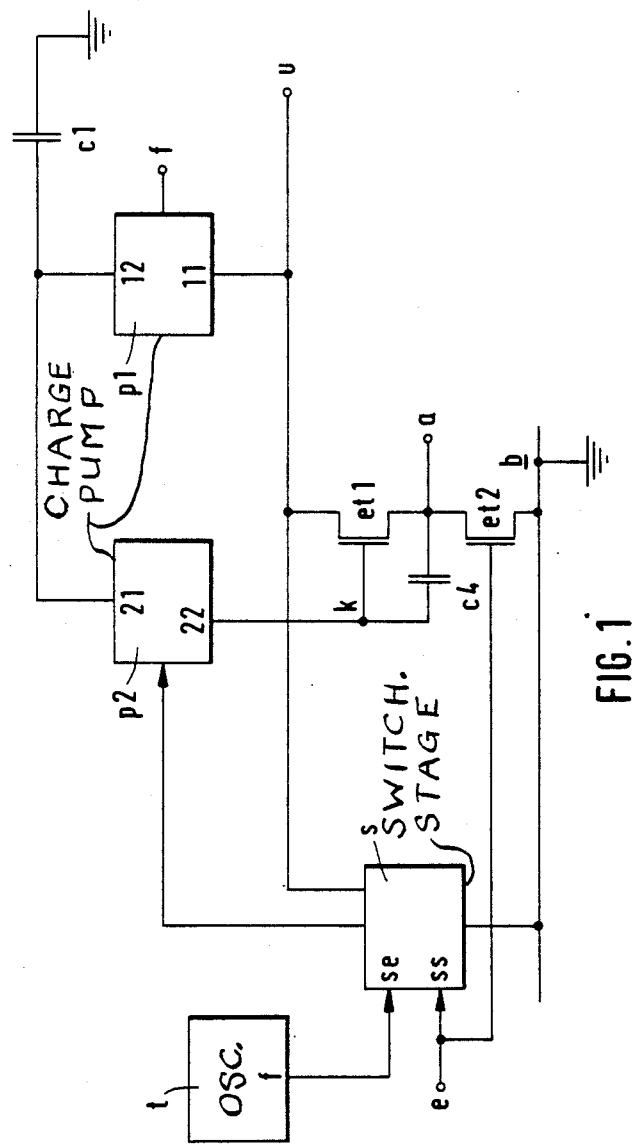
FIG. 1 is a schematic circuit diagram of a bootstrap push-pull stage according to the invention.

The schematic circuit diagram of FIG. 1 shows the bootstrap push-pull stage b with the two enhancement-mode output-stage transistors, et1, et2, whose source-drain paths are connected in series between the supply voltage u and ground, the node of the source-drain paths being the output a of the bootstrap push-pull stage b. The bootstrap capacitor c4 is connected to the gate of the output-stage transistor et1, thereby forming the bootstrap node k, and to a point following the potential of the output a; in FIG. 1, this point is the output a itself. The drain of the output-stage transistor et1 is coupled to the supply voltage u. The first charge pump circuit p1 has its clock input connected to the output f of the clock oscillator t, and its first direct-voltage terminal 11, whose polarity is opposite to that the supply voltage u, is connected to the supply voltage u.

The second direct-voltage terminal 12 of the first charge pump circuit p1 is connected to the first direct-voltage 21 of the second charge pump circuit p2; the polarity of this terminal 21 is opposite to that of the supply voltage u. The second direct-voltage terminal 22 of the second charge pump ciruit p2 is connected to the bootstrap node k. The second direct-voltage terminal 12 of the first charge pump circuit p1 and the first direct-voltage terminal 21 of the second charge pump circuit p2 are grounded through the first capacitor c1, which serves as a smoothing capacitor. The clock input of the second charge pump circuit p2 is connected to the output of the switching stage s, whose signal input se and control input ss are connected to the output f of the clock oscillator t and to the control input e of the bootstrap push-pull stage, respectively. The switching stage s passes on the clock signal when the input signal of the bootstrap push-pull stage b is at the logic level assigned to the supply voltage u. In the schematic circuit diagram of FIG. 1, the input e is shown connected to the gate of the grounded output-stage transistor et2 for simplicity.

Figure 2:
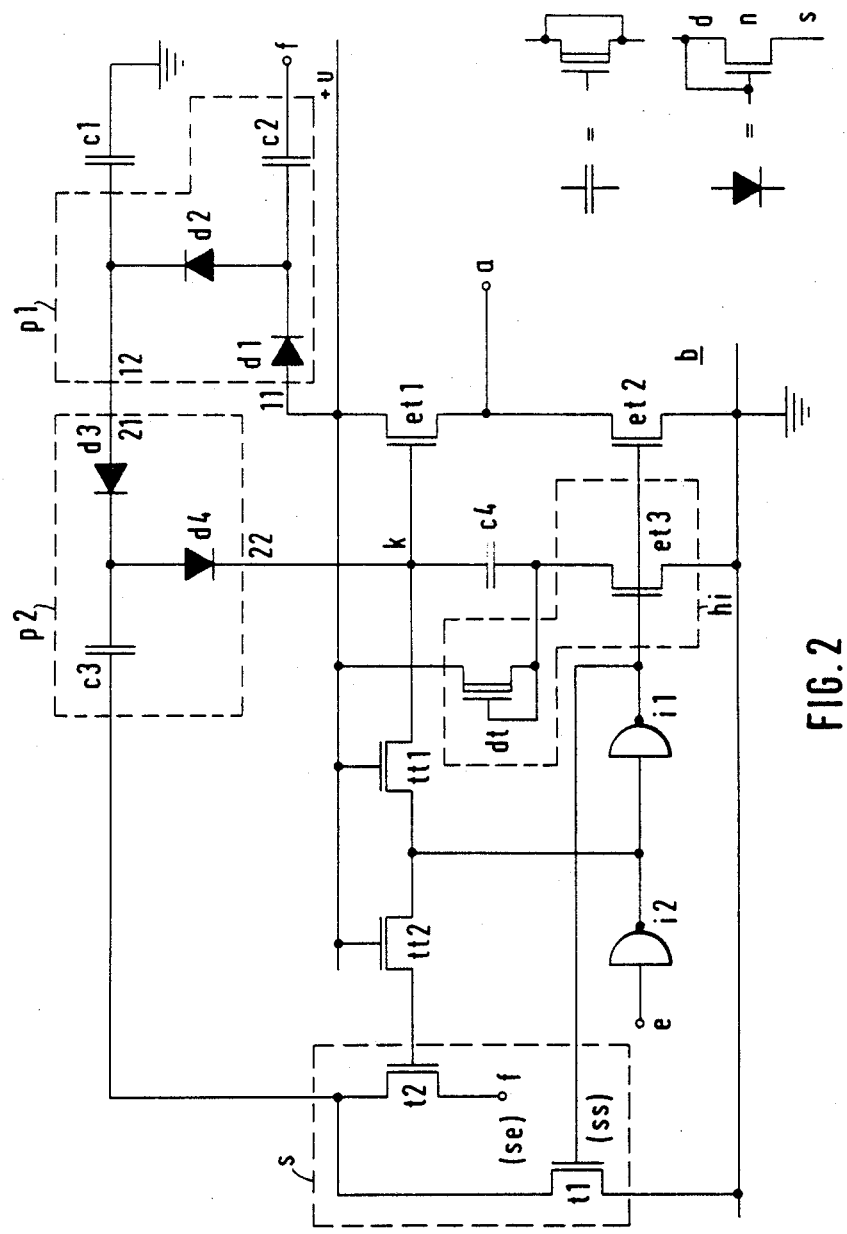
FIGS. 2 and 3 are circuit diagrams of different embodiments of such a bootstrap push-pull stage.
Figure 3:
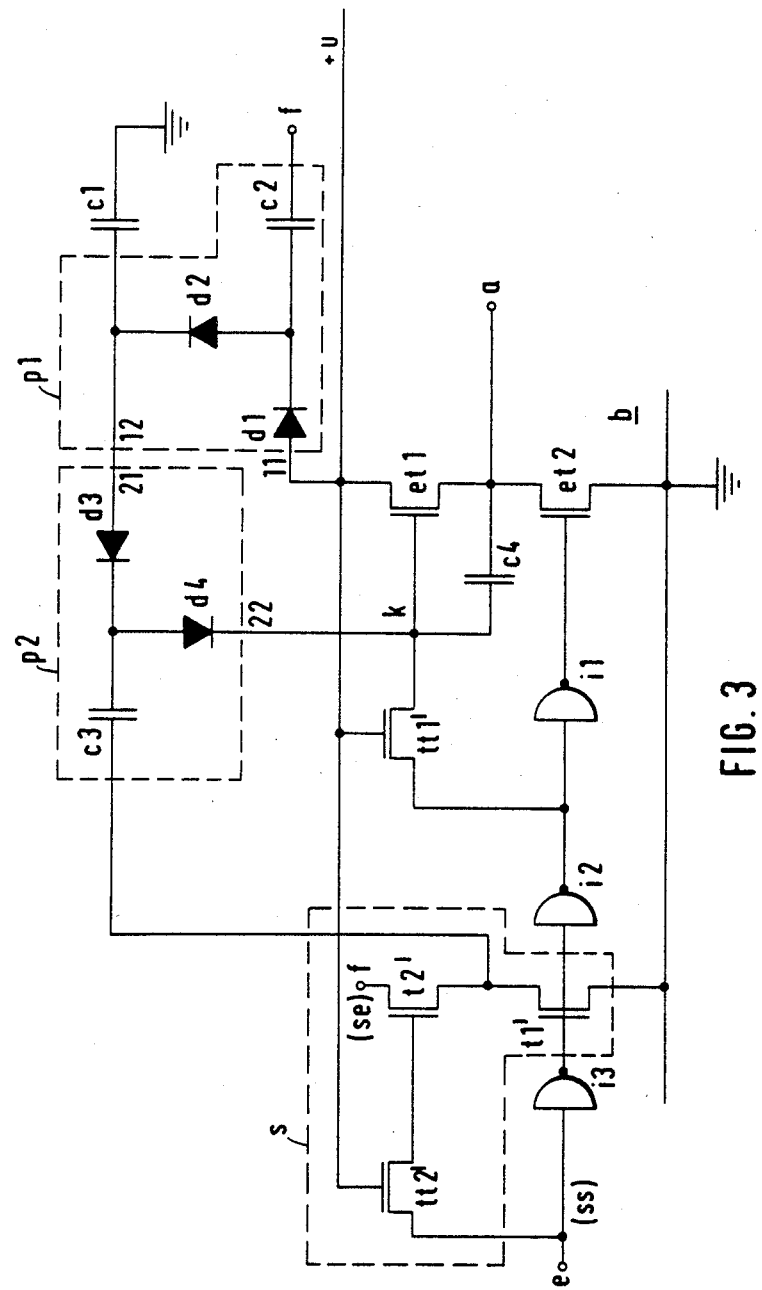

FIGS. 2 and 3 are circuit diagrams of different embodiments of a bootstrap push-pull stage according to the invention. In both embodiments, the charge pump circuits p1, p2 are of the same design; the first, p1, consists of the first and second MOS diodes d1, d2 and the second capacitor c2, and the second, p2, consists of the third and fourth MOS diodes d3, d4 and the third capacitor c3, with the MOS diodes d1, d2 and d3, d4 connected in series in the same direction between the direct-voltage terminals 11, 12, and 21, 22, respectively, of the charge pump circuits.

In FIGS. 2 and 3, the supply-voltage u is assumed to be positive (+u), so the transistors are n-channel transistors. Then, the cathode, the first MOS diode d1 and the anode of the second MOS diode d2 are connected to the output f of the clock oscillator t through the second capacitor c2, and the cathode of the third MOS diode d3 and the anode of the fourth MOS diode d4 are connected to the output of the switching stage s through the third capacitor c3. The anode of the first MOS diode d1 is connected to the supply voltage +u, and the cathode of the fourth MOS diode d4 to the bootstrap node k.

In FIG. 2, that terminal of the bootstrap capacitor c4 which is not connected to the bootstrap node is tied to the output of the auxiliary inverter hi. The latter consists of the transistor et3, whose gate is connected to the gate of the output-stage transistor et2 and whose source is grounded, and the depletion-mode transistor dt, used as a load device and having its drain connected to the supply voltage +u. Associated with the output-stage transistors et1, et2 is the drive stage formed from the enhancement-mode transfer transistor tt1 and the two inverters i1, i2, with the gate of the grounded output-stage transistor et2 connected to the output of the first inverter i1, whose input is connected to the bootstrap node k via the source-drain path of the first transfer transistor tt1, whose gate is connected to the supply voltage +u, and to the input e of the bootstrap push-pull stage via the second inverter i2. The switching stage s of FIG. 2 consists of the first enhancement-mode transistor t1, whose source-drain path is located between the output of this stage and ground and whose gate, representing the control input ss, is connected to the output of the first inverter i1, and the second enhancement-mode transistor t2, whose source-drain path is located between the output of the signal input se of the switching stage ss, and whose gate is connected via the source-drain path of the second enhancement-mode transfer transistor tt2, which has its gate connected to the supply voltage, to the output of the second inverter i2 and via the source-drain path of the first transfer transistor tt1 to the bootstrap node k.

In FIG. 3, the terminal of the bootstrap capacitor c4 not connected to the bootstrap node is tied directly to the output a of the bootstrap push-pull stage. The gate of the output-stage transistor et1 is connected to the output of the first inverter i1 of the driver stage, and the input of this first inverter i1 is connected to the output of the second inverter i2 and, through the source-drain path of the transfer transistor tt1′, whose gate is connected to the supply voltage +u, to the bootstrap node k. The input of the second inverter 12 is connected to the output of the third inverter i3, which has its input connected to the input e of the bootstrap push-pull stage b. The output of the third inverter i3 is also connected to the gate of the first enhancement-mode transistor t1′ of the switching stage s. The source-drain path of this transistor is inserted between ground and the output of this stage. The second enhancement-mode transistor t2′ has its source-drain path connected between the output and the signal input se of the switching stage s, and its gate is connected to the input e through the source-drain path of the transfer transistor tt2′, whose gate is coupled to the supply voltage +u.

The MOS diodes d1 . . . d4 are n-channel enhancement-mode transistors with a gate-drain connection as the anode, and the capacitors c1, c2, c3 and the bootstrap capacitor c4 are MOS transistors of the same type with a drain-source connection.

To explain the operation of the circuit, reference will be made to FIG. 3.

It is assumed that the H level is the more positive of the two binary-system logic levels, and the L level the more negative one. Since the clock signal from the clock oscillator t is applied continuously to the pump circuit p1, the latter establishes at the ungrounded terminal of the first capacitor c1 a potential lying above the supply potential +u. This higher potential is further increased by the second pump circuit p2 with respect to the bootstrap node k depending on the logic signal at the input e. If the input e is at an H level, the gate of the transistor t2′ is at an H level, too, while the gate of the transistor t1′ is low. Both conditions together cause the clock signal to be transferred to the second pump circuit p2, which thus applies a correspondingly high voltage to the bootstrap node k. The H level at the input e causes an H level at the bootstrap k via the inverters i3, i2 and the transfer transistor tt1′. Since, on the other hand, the H level at the input e results in an L level at the gate of the output-stage transistor et2 because of the inverters i3, i2, i1, this transistor is cut off, so that the output a like the bootstrap node k, is at an H level. As long as the input e is high, i.e., as long as the output is to be high, too, this condition is maintained regardless of the leakage currents effective at the bootstrap node k, because the two pump circuits p1, p2 compensate for the leakage currents and, thus, maintain the high potential at the bootstrap node k that is required for the H level at the output a.

Viewed from an L state preceding the above-mentioned H state at the input e, the turnoff of the output-stage transistor et2 is delayed by the delay of the inverter i1 with respect to the generation of the H level at the bootstrap node k, so that the output a does not change from the L level caused by the L level at the input e to the H level until the H level is present at the bootstrap node k, i.e., the bootstrap action of the bootstrap capacitor c4 can take full effect.

If the input e is at an L level, the gate of the transistor t1′ is at an H level, so that this transistor is conducting, and the gate of the transistor t2′ is at an L level, so that this transistor is cut off. Thus, the capacitor c3 is practically at ground potential, and no clock signals are transferred to the second pump circuit p2. The bootstrap node k is at an L level, on which, however, the potential across the capacitor c1 is superimposed, which is applied therethrough the diodes d3, d4. The output-stage transistor et2 is constantly on because of the H level at its gate, so that the output a is at an L level.

During each L to H transition, the transfer transistors tt1′ and tt2′ cause a bootstrap effect at the gates of the output-stage transistor et1 and the transistor t2′, respectively, which are connected to them. This has a favorable effect on the switching conditions and, thus, the slope of the transition edge.

What is claimed is:

1. A digital monolithic integrated bootstrap push-pull stage using insulated-gate field-effect transistor technology and comprising:

an input terminal;

first and second enhancement-mode output-stage transistors having their drain-source paths connected in series between a supply voltage terminal and a ground terminal, the drain source path of said first transistor connected to said supply voltage terminal said second transistor having its gate connected to said input terminal;

an output terminal coupled to the junction of said first and second transistors;

a bootstrap capacitor having a first terminal connected to the gate of said first transistor whereby a bootstrap node is formed, and having a second terminal connected to a circuit point which follows the potential at the output of the bootstrap push-pull stage;

a first charge pump circuit having a first clock input terminal for receiving clock signals, a first direct-voltage terminal connected to said supply voltage terminal, and a second direct-voltage terminal having a voltage polarity opposite to that of the supply voltage;

a second charge pump circuit having a first direct-voltage terminal having a voltage polarity opposite to that of the supply voltage and coupled to said first charge pump second direct voltage terminal, a second direct-voltage terminal connected to said bootstrap node, and a second clock input terminal for receiving clock signals; and a switching stage having a third input terminal coupled to said input terminal and having a third clock input terminal for receiving said clock signals and having a clock output terminal for coupling said clock signals to said second clock input terminal via said clock output terminal if the input signal to said bootstrap push-pull stage at said input terminal is at a logic level assigned to the supply voltage at said supply voltage terminal.

2. A bootstrap push-pull stage in accordance with claim 1, wherein said second direct-voltage terminal of said first pump circuit and said first direct-voltage terminal of said second charge pump circuit are grounded through a first capacitor.

3. A bootstrap push-pull stage in accordance with claim 1, wherein:
   said first charge pump circuit comprises first and second MOS diodes serially connected between said first and second direct-voltage terminals of said first charge pump circuit; and
   said second charge pump circuit comprises third and fourth MOS diodes connected in series between said first and second direct-voltage terminals of said second charge pummp circuit.

4. A bootstrap push-pull stage in accordance with claim 3 using n-channel transistors, wherein:
   said first charge pump circuit includes a second capacitor, the cathode of said first MOS diode and the anode of said second MOS diode being connected to said first clock input terminal through said second capacitor;
   said second charge pump circuit includes a third capacitor, the cathode of said third MOS diode and the anode of said fourth MOS diode are connected to said clock output terminal of said switching stage through said third capacitor; and
   the anode of the first MOS diode and the cathode of the fourth MOS diode are connected respectively to said supply voltage terminal and said bootstrap node.

5. A bootstrap push-pull stage in accordance with claim 4, wherein said second terminal of said bootstrap capacitor is connected to the output of said bootstrap push-pull stage.

6. A bootstrap push-pull stage in accordance with claim 4 comprising:
   an auxiliary inverter having an output coupled to said bootstrap capacitor second terminal and an input coupled to the gate of said second output stage transistor; and
   a depletion mode transistor is used as a load in said auxiliary inverter.

7. A bootstrap push-pull stage in accordance with claim 6 using n-channel transistors, and wherein said depletion-mode transistor has its gate and source connected to said second terminal of said bootstrap capacitor.

8. A bootstrap push-pull stage in accordance with claim 4 wherein:
   said first, second, third and fourth MOS diodes each comprise an enhancement-mode transistor with a gate-drain connection forming the anode; and
   said boostrap capacitor and said second and third capacitors each comprise a transistor with a drain-source connection.

9. A bootstrap push-pull stage in accordance with claim 7 wherein:
   said first, second, third and fourth MOS diodes each comprise an enhancement-mode transistor with a gate-drain connection forming the anode; and
   said bootstrap capacitor and said second and third capacitors each comprise a transistor with a drain-source connection.

10. A bootstrap push-pull stage in accordance with claim 9 including: a driver stage having a first inverter, a second inverter and a first enhancement-mode transfer transistor; and wherein
    the output of said first inverter is connected to the gate of said second output-stage transistor, the input of said first inverter is connected to said bootstrap node via the source-drain path of said first enhancement-mode transfer transistor, said transfer transistor having its gate connected to said supply terminal, and the input terminal of said bootstrap push-pull stage is connected to the input of said second inverter, and the output of said second inverter is connected to said input of said first inverter.

11. A bootstrap push-pull stage in accordance with claim 10, wherein said switching stage includes:
    a third enhancement-mode transistor having a source-drain path connected between the clock output terminal of said switching stage and said ground terminal and a gate connected to the output of said first inverter;
    a fourth enhancement-mode transistor having its source-drain path connected between said clock output terminal and said third clock input terminal of said switching stage; and
    a second enhancement-mode transfer transistor having a source-drain path connected between the gate of said fourth enhancement-mode transistor and the output of said second inverter and a gate connected to said supply voltage terminal.

12. A bootstrap push-pull stage in accordance with claim 10, wherein:
    said switching stage includes a third inverter, a fifth enhancement-mode transistor having its drain-source path connected between said switching stage clock output terminal and said ground terminal and having its gate connected to the output of said third inverter, a sixth enhancement-mode transistor having its source-drain path connected between said switching stage third clock input terminal and said clock output terminal and a third enhancement-mode transfer transistor having its source-drain path connected between the third input terminal and the gate of said sixth enhancement-mode transistor and having its gate connected to said supply voltage terminal; and
    the input of said second inverter is connected to the output of said third inverter.

* * * * *